(12) United States Patent
kumar et al.

(10) Patent No.: US 9,401,722 B2
(45) Date of Patent: Jul. 26, 2016

(54) AUTOCONFIGURABLE PHASE-LOCKED LOOP WHICH AUTOMATICALLY MAINTAINS A CONSTANT DAMPING FACTOR AND ADJUSTS THE LOOP BANDWIDTH TO A CONSTANT RATIO OF THE REFERENCE FREQUENCY

(75) Inventors: Ajay kumar, Dallas, TX (US); Krishnaswamy Nagaraj, Plano, TX (US); Joonsung Park, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 188 days.

(21) Appl. No.: 13/525,285

(22) Filed: Jun. 16, 2012

(65) Prior Publication Data

US 2012/0319786 A1     Dec. 20, 2012

Related U.S. Application Data

(60) Provisional application No. 61/498,922, filed on Jun. 20, 2011.

(51) Int. Cl.
*H03L 7/099* (2006.01)
*H03L 7/02* (2006.01)
*H03L 7/093* (2006.01)
*H03L 7/089* (2006.01)
*H03L 7/107* (2006.01)
*H03L 7/06* (2006.01)
*H03L 7/18* (2006.01)

(52) U.S. Cl.
CPC .............. *H03L 7/093* (2013.01); *H03L 7/0896* (2013.01); *H03L 7/0898* (2013.01); *H03L 7/06* (2013.01); *H03L 7/107* (2013.01); *H03L 7/1072* (2013.01); *H03L 7/1075* (2013.01); *H03L 7/18* (2013.01); *H03L 2207/04* (2013.01)

(58) Field of Classification Search
CPC ......... H03L 7/06; H03L 7/107; H03L 7/1072; H03L 7/1075; H03L 7/093; H03L 7/0896; H03L 7/0898; H03L 7/18; H03L 2207/04
USPC .......... 331/1 R, 10, 16, 18, 34; 327/156, 157; 375/376
See application file for complete search history.

(56) References Cited

U.S. PATENT DOCUMENTS

| | | | | |
|---|---|---|---|---|
| 5,260,979 A | * | 11/1993 | Parker et al. | 375/366 |
| 5,631,587 A | * | 5/1997 | Co et al. | 327/107 |
| 6,060,922 A | * | 5/2000 | Chow | H03K 5/1565 327/175 |
| 6,873,214 B2 | * | 3/2005 | Harwood | 331/17 |
| 2009/0278614 A1 | * | 11/2009 | Dosho et al. | 331/17 |
| 2010/0127739 A1 | * | 5/2010 | Ebuchi et al. | 327/148 |
| 2010/0207673 A1 | * | 8/2010 | Kim et al. | 327/157 |
| 2011/0068828 A1 | * | 3/2011 | Anderson | G01R 31/31726 327/48 |

* cited by examiner

*Primary Examiner* — Richard Tan
(74) *Attorney, Agent, or Firm* — John R. Pessetto; Frank D. Cimino

(57) ABSTRACT

A phase-locked loop (PLL) includes a state machine programmed to automatically produce a set of control signals to select a charge-pump current and integrating capacitance value to automatically adjust a loop bandwidth of the PLL. A charge-pump DAC generates a charge-pump current of magnitude controlled by the state machine control signals. An integrator integrates the charge-pump output current to produce an integrated charge-pump output signal. The integrator has a plurality of capacitors switchably selected by control signals from the state machine to produce an integrating capacitance value. A voltage controlled oscillator (VCO) produces a PLL output frequency in response to the integrated charge-pump output signal.

2 Claims, 9 Drawing Sheets

| $F_{REF\_INT}$ | $F_{OUT}$ | $M_{DIV}$ | $C_{CYC}$ | K | ICP | η | C1 |
|---|---|---|---|---|---|---|---|
| 2M | 400M | 200 | 40 | 1 | 1.5 | 1 | 60p |
| 2M | 600M | 300 | 60 | 1.5 | 2.25 | 1 | 60p |
| 2M | 100M | 10 | 10 | 0.25 | 0.375 | 1 | 60p |
| 30M | 600M | 20 | 60 | 1.5 | 2.25 | 15 | 4p |
| 30M | 100M | 10 | 10 | 0.25 | 0.375 | 15 | 4p |

AUTOCONFIGURABLE PHASE-LOCKED LOOP WHICH AUTOMATICALLY MAINTAINS A CONSTANT DAMPING FACTOR AND ADJUSTS THE LOOP BANDWIDTH TO A CONSTANT RATIO OF THE REFERENCE FREQUENCY

CROSS-REFERENCE TO RELATED APPLICATIONS

This application claims the priority benefit of U.S. provisional patent application No. 61/498,922, filed Jun. 20, 2011, which is assigned to the assignee hereof and incorporated herein by reference in its entirety.

BACKGROUND

1. Field

The various circuit embodiments described herein relate in general to phase-locked loops (PLLs), and, more specifically, to PLLs and methods for making and using the same in which the loop bandwidth scales with PLL the reference frequency while maintaining a constant damping factor, $F_{REF}$, without a requirement that the value of the reference frequency, $F_{REF}$, be known.

2. Background

An example of a typical phase-locked loop circuit (PLL) 10 is shown in FIG. 1, to which reference is now made. The PLL 10 has a digital phase-frequency detector (DPFD) 12, herein sometimes referred to as a "phase detector," that receives a reference frequency ($F_{REF}$) signal on a first input line 14 and a feedback signal on a second input line 16. The DPFD 12 determines whether the phase of the feedback signal leads or lags the phase of the reference frequency, $F_{REF}$, to command either an up or down signal on output lines 18 and 20, respectively. The up command, for example, indicates that the phase of the feedback signal leads the phase of the reference frequency, $F_{REF}$, and the down command indicates that the phase of the feedback signal lags the phase of the reference frequency, $F_{REF}$.

The signal on the up output line 18 controls a switch 22 to apply current from a first current source 24 to an integrator 26 to increase the voltage on the input 27 of the transconductance amplifier 28. The signal on the down output line 20 controls a switch 30 to sink current through a second current source 32 from the integrator 26 to a reference potential, or ground, to decrease the voltage on the input of the transconductance amplifier 28. The integrator 26 has a first capacitor 34 between the input 27 to the transconductance amplifier 28 and a reference potential or ground. In addition, the integrator 26 has a resistor 36 and a second capacitor 38 in series between the input to the transconductance amplifier 28 and the reference potential, or ground.

The transconductance amplifier 28 produces an output current, $I_{VCO}$, on line 40 to control the frequency of a voltage-controlled oscillator (VCO) 42. The VCO 42 produces a base output frequency on line 44 that is proportional to the input voltage to the transconductance amplifier 28, which, as described above, is proportional to the amount of lead or lag of the phase of the feedback voltage on line 16 with respect to the reference frequency, $F_{REF}$. The base output frequency from the VCO 42 on line may be divided by a number, for example $Q_{DIV}$, by a frequency divider 46 to provide a PLL frequency output, $F_{OUT}$, on output line 48. The base frequency output from the VCO 42 on line 44 may also be divided by a number, for example, $M_{DIV}$, to provide a frequency output on feedback line 16 to the second input of the DPFD 12 for comparison with the reference frequency, $F_{REF}$. The base frequency output from the VCO 42 can also be feedback to the DPFD 12 by another means to make a comparison with the reference frequency, $F_{REF}$.

One of the problems, however, especially for a chip manufacturer, is that often the value of the reference frequency, $F_{REF}$, that customers may employ in the operation of the PLL is not known. Consequently, the design of a single PLL that is suitable for diverse purposes can be very difficult. Moreover, PLLs are often designed to operate over a large reference frequency range. For example in some applications, the reference frequency, FREF, may be anywhere in a range between 2 MHz and 30 MHz.

This can be appreciated from an analysis of the loop behavior of the circuit 10 of FIG. 1, which can be modeled by the phase-domain model 50 of FIG. 2, to which reference is now additionally made. In the phase-domain model 50 of FIG. 2, the phase of the input signal, $\phi_{REF}$, is applied on line 52 to an adder 54, the output of which is applied to a loop filter 56. The loop filter 56 models the transistor level response of the feedback loop of the circuit 10 of FIG. 1. The output of the loop filter 56 is applied to a transconductance amplifier 58, which produces an output that is applied to an integrating capacitor 60 and to a delay block 62. The transconductance amplifier 58 along with the integrating capacitor 60 models the behavior of the transconductor circuit 28, VCO 42, and feedback divider 47 of FIG. 1. The delay supplied by the delay block models the sample and hold delay of the DPFD 12, which in the example illustrated is chosen to be equal to 0.6 times the time period of the $F_{REF}$ signal. The output of the delay block 62 is subtracted in the adder 54 from the input phase reference signal, $\phi_{REF}$, on line 52. To complete the model of the loop behavior, $K_{VCO}$ is simulated from the given oscillator architecture.

FIG. 3, to which reference is now additionally made, is a graph of closed loop gain in dB verses frequency for two input reference frequencies of 2 megahertz and 30 megahertz. Thus, for a range of reference frequencies, $F_{REFs}$, between 2 MHz and 30 MHz (the actual value being unknown)+$N_{DIV}$ (the actual value being unknown) the following issues occur.

A typical PLL is designed with a loop-bandwidth of less than $F_{REF}/10$ in order to get a stable response from the PLL across all process and voltage corners. Higher loop-bandwidth translates to faster settling time for the PLL 10. However, the absolute value of the bandwidth can be chosen based on the particular application in which the PLL is used. The zero 66 of the loop-filter which is formed by resistor 36 and capacitor 38 is usually chosen to be a factor 1/K1 of the loop-bandwidth. The absolute value of the factor 1/K1 can change with the intended application. As an example, in this embodiment the factor is set at K1=3, so zero 66 is parked near 66 KHz. The pole 68, which is formed by resistor 36 and the series combination of capacitor 34 and capacitor 38, is usually chosen to be a factor K2 of the loop-bandwidth. In this embodiment the value of K2 is chosen to be 3 so pole 68 is set at 600 KHz.

With the above combination of loop-filter pole and zero, the bandwidth comes close to desired value of 200 KHz as shown by curve 67 of FIG. 3. The value of the charge-pump is chosen in conjunction of loop-gain such that the loop is stable and loop-peaking is met for the application. Now if a traditional PLL, which is designed for $F_{REF}$=2 MHz and output of 400 MHz, is used with input $F_{REF}$=30 MHz, then it does not work, because for 30 MHz PLL, the desired loop-bandwidth would be 3 MHz and in that case both designed zero 66 and pole 68 will come inside the loop-bandwidth as shown in FIG. 4. As a result the PLL loop frequency response becomes the curve 72 shown in FIG. 3 which has over 20 dB of peaking. This implies that system has gone unstable.

Another challenge is that it is desirable for the output frequency, $F_{OUT}$, be in a range between 100 MHz and 500 MHz. The applicable formulae are:

$$LG = \frac{I_{CP} K_v K_{LPF}}{M}$$

$$\omega_n = \sqrt{\frac{I_{CP} K_v}{MC_1}}$$

$$\zeta = \frac{1}{2} \sqrt{\frac{I_{CP} K_v C_1}{M}} R_1$$

$$\omega_u = \frac{I_{CP} K_v R_1}{M}$$

where:
LG is the loop gain
$I_{CP}$ is the charge-pump current
$K_v$ is the gain of the VCO 42
$K_{LPF}$ is the response of the loop low-pass filter 56
M is the frequency divisor in the feedback loop
$\omega_n$ is the natural frequency of the loop
$C_1$ is the capacitance of the loop zero capacitor 60
$\zeta$ is the loop damping factor
R1 is the resistance of the loop zero resistor 36
$\omega_u$ is the frequency of the unity gain cross-over point For the case where the loop frequency, $F_{REF}$, is 2 MHz, the loop bandwidth is 200 KHz, and the zero is at 50 KHz, the charge-pump current, $I_{CP}$, is chosen so that the damping factor, $\zeta$, is approximately 1 for an output frequency, $F_{OUT}$, of 400 MHz. This can be seen in the graph of loop gain verses frequency of FIG. 5, to which reference is now additionally made. The curve 80 shows the 400 MHz frequency response and curve 82 shows a 100 MHz frequency response. Over an output frequency range between 100 MHz and 500 MHz, with $I_{CP}$ held constant and $M_{DIV}$ varying from 50 to 250, it can be seen that the loop gain has an increase factor of five, and is only marginally stable. Thus, even though the reference frequency, $F_{REF}$, may be known, loop may become unstable. Therefore, in order to maintain loop stability, the traditional approach requires the user to specify information about the reference frequency, $F_{REF}$, to enable the charge-pump current, $I_{CP}$, to be scaled with respect to the frequency divider, $M_{DIV}$.

Nevertheless, even though a reference frequency, $F_{REF}$, may be specified, as a practical matter, most PLL designs are optimized for only a few reference frequencies, $F_{REFs}$. For other reference frequencies, $F_{REFs}$, the damping factor, $\zeta$, may still change. Changes in the damping factor, $\zeta$, may cause overshoot and stress the device.

What is needed, therefore, is a PLL and method for making and using it in which the loop bandwidth scales with the reference frequency, $F_{REF}$, whereby it is not necessary to actually know the reference frequency, $F_{REF}$. Also needed is an autoconfigurable phase-locked loop which automatically maintains a constant damping factor and adjusts the loop bandwidth to a constant ratio of the reference frequency.

SUMMARY

According to one embodiment disclosed herein, a phase-locked loop (PLL) includes a frequency detector for detecting a frequency of an unknown reference frequency and a phase detector for generating up and down command signals in response to phase differences between the unknown reference frequency and a frequency related to a base PLL output frequency. A circuit is provided for producing control signals in dependence upon the frequency detected by the frequency detector. A charge-pump DAC generates a charge-pump current and is connected to receive the up and down command signals and control signals from the circuit for producing control signals to produce a charge-pump output current of magnitude selected by the control signals from the circuit for producing control signals. An integrator integrates the charge-pump output current and has a plurality of capacitors switchably selected by control signals from the circuit for producing control signals to produce an integrating capacitance value. A voltage controlled oscillator (VCO) produces the base PLL output frequency in response to the integrated charge-pump output signal. In one embodiment, the circuit for producing control signals is a state machine that is programmed to automatically produce a set of control signals to select a charge-pump current and integrating capacitance value to automatically adjust a loop bandwidth of the PLL.

According to another embodiment disclosed herein, a phase-locked loop (PLL) includes means for automatically adjusting a loop bandwidth without requiring knowledge of a reference frequency of the PLL. The means for automatically adjusting the loop bandwidth includes a circuit for measuring a frequency related to the reference frequency, a state machine for producing logic states corresponding to the frequency related to the reference frequency, a first digital-to-analog converter connected to adjust capacitances in the PLL according to the logic states of the state machine, and a second digital-to-analog converter connected to modify a charge-pump current to an integrator of the PLL according to the logic states of the state machine. The PLL 1 automatically maintains a constant damping factor.

According to yet another embodiment disclosed herein a method is provided for automatically adjusting a loop bandwidth of a phase-locked loop (PLL). The method includes detecting a frequency of an unknown reference frequency and generating up and down command signals in response to phase differences between the unknown reference frequency and a PLL output frequency. Control signals are developed, depending on the detected frequency. In one embodiment, the control signals are developed by a state machine. A charge-pump current of magnitude established by the control signals is generated, and an integrated charge-pump current is produced using capacitors selected according to the control signals. The frequency of a voltage controlled oscillator (VCO) is adjusted, based on the integrated charge-pump current to producing the PLL output frequency.

BRIEF DESCRIPTION OF THE DRAWINGS

In the various figures of the drawing, like reference numbers are used to denote like or similar parts.

DETAILED DESCRIPTION

Figure 6:
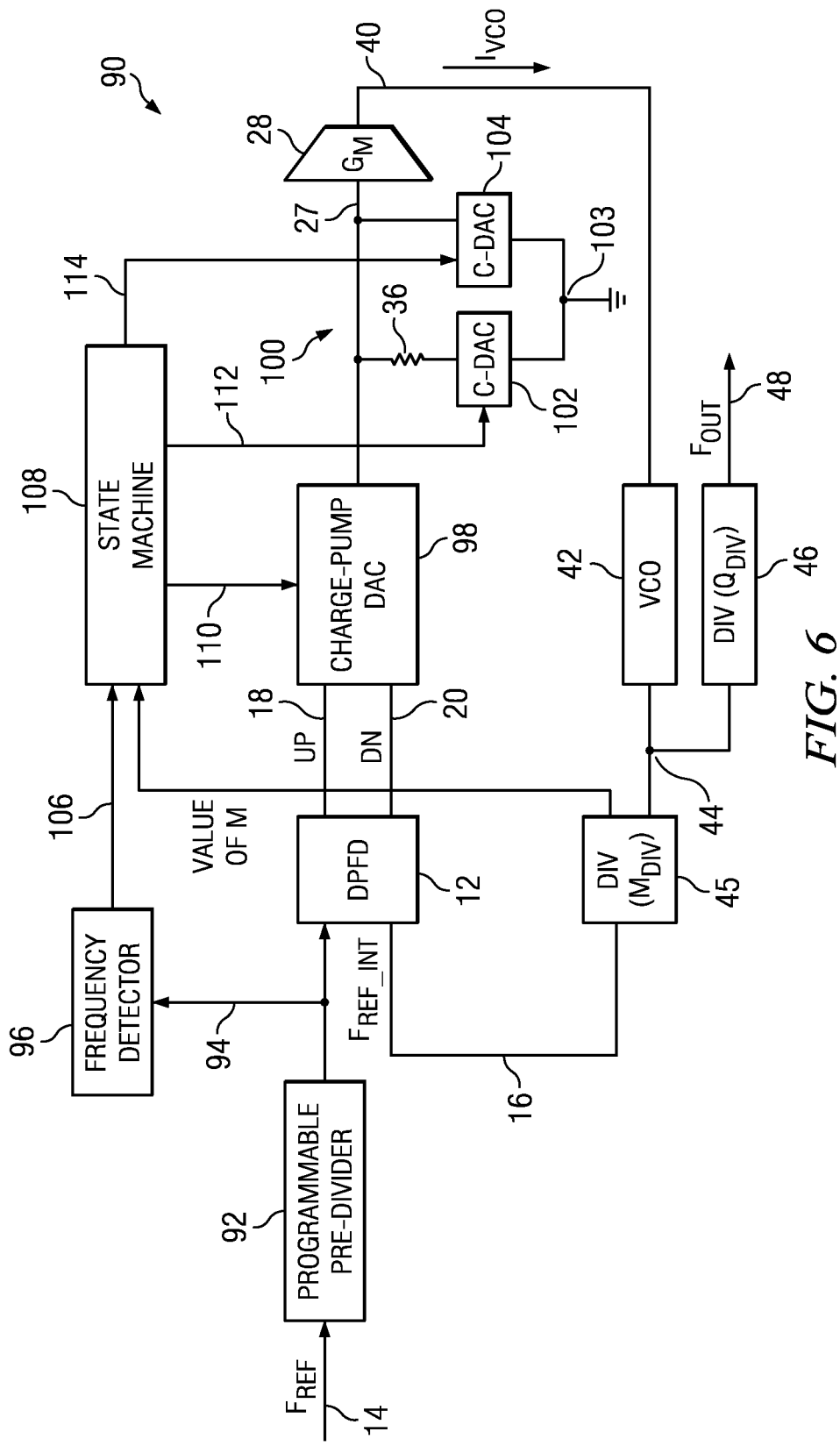
FIG. 6 is an electrical schematic diagram showing an example of an autoconfigurable phase-locked loop (PLL) circuit that automatically adjusts the loop bandwidth and maintains a constant damping factor.

FIG. 6 is an electrical schematic diagram showing an example of an autoconfigurable phase-locked loop (APLL) circuit 90 that automatically adjusts the loop bandwidth and maintains a constant damping factor. The APLL circuit 90 receives the reference frequency, $F_{REF}$, on input line 14 to a user programmable pre-divider circuit 92 to produce an internal reference frequency $F_{REF\_INT}$ on line 94. The internal reference frequency $F_{REF\_INT}$ is connected to a digital phase-frequency detector (DPFD) 12 as well as a frequency detector 96. The DPFD 12 develops up and down charge-pump command DAC signals on respective lines 18 and 20 in the manner described above with reference to FIG. 1, depending on whether the phase of the feedback signal on line 16 leads or lags the phase of the internal reference frequency $F_{REF\_INT}$.

A charge-pump DAC circuit 98, described in greater detail with reference to FIG. 9 below, has an output on line 27 that is integrated by an integrator 100 to increase or decrease the input voltage on the transconductance amplifier 28. The charge-pump DAC 98 includes a number of switches that may be connected in various combinations to provide selected charge-pump currents, depending on the value of the internal reference frequency, $F_{REF\_INT}$.

Figures 7, 8:
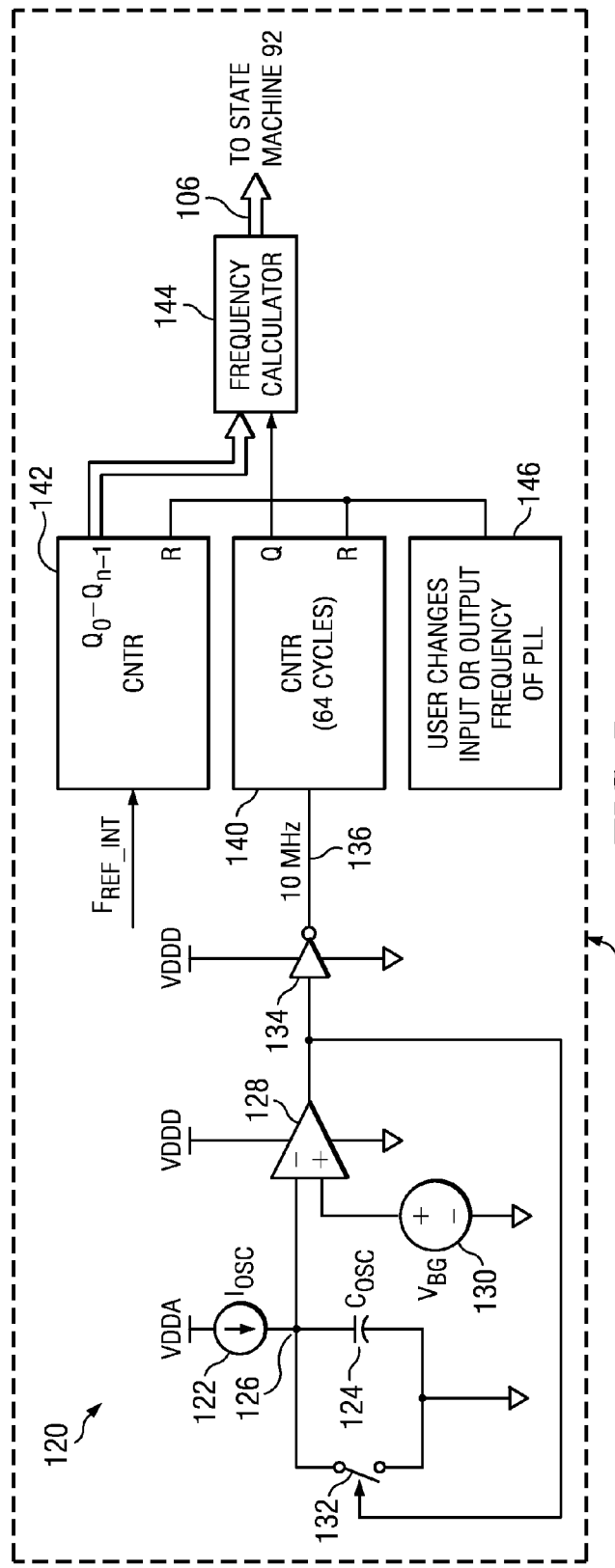
FIG. 7 is an electrical schematic diagram showing an example of a frequency detector circuit for providing input states to the state machine of FIG. 6.
FIG. 8 is a state table showing an example of various states of a state machine for controlling a charge-pump DAC and capacitor DACs for reference frequencies of 2 MHz and 30 MHz, and output frequencies of 100 MHz, 400 MHz, and 600 MHz.

The integrator 100 includes a first capacitor-DAC circuit 102 in series with the resistor 36 between the line 27 and a reference potential, or ground node 103. The integrator 100 also has a second capacitor-DAC circuit 104 connected directly between the line 27 and the reference potential or ground node. Details of the first and second capacitor-DAC circuits 102 and 104 are shown in greater detail in FIG. 11 below. The capacitor-DAC 102 and the capacitor DAC 104 each comprise a number of capacitors that may be connected in various combinations to provide selected capacitances, also depending on the value of the internal reference frequency, $F_{REF\_INT}$. These selections are accomplished by detecting the frequency of the internal reference frequency, $F_{REF\_INT}$, in the frequency detector 96, which is described in greater detail with reference to FIG. 7 below.

Figure 1:
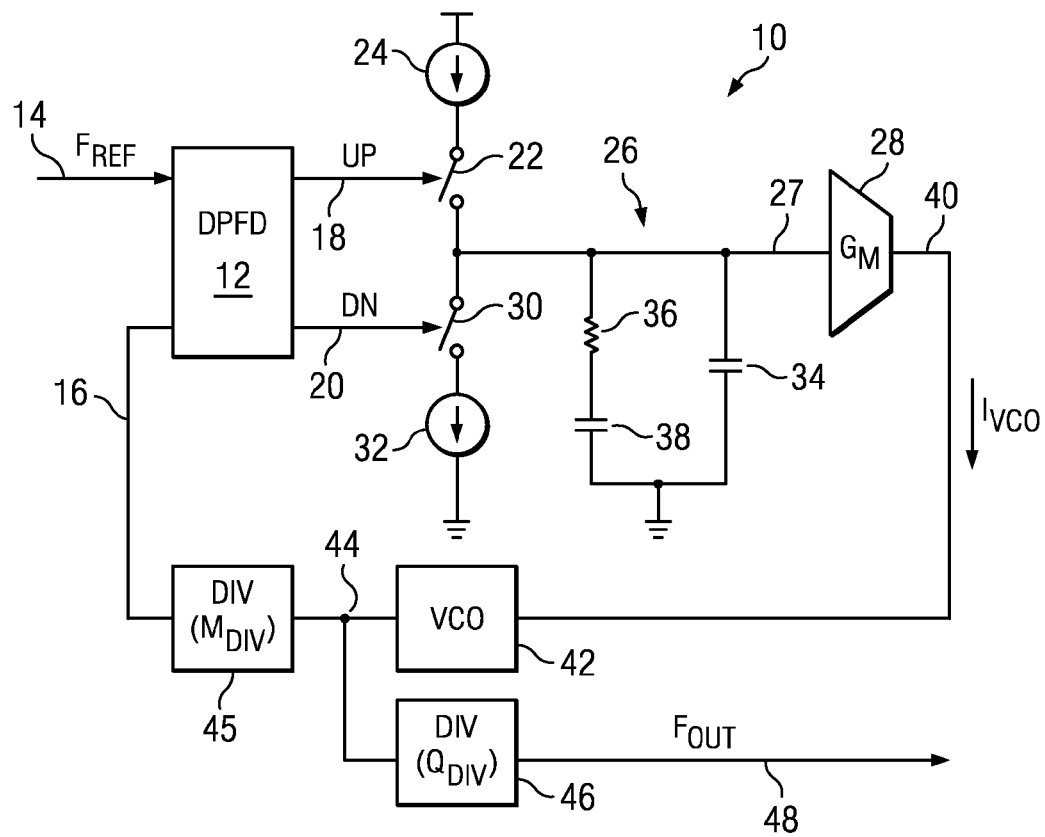
FIG. 1 is an electrical schematic diagram showing an example of a typical phase-locked loop (PLL) circuit.
Figure 2:
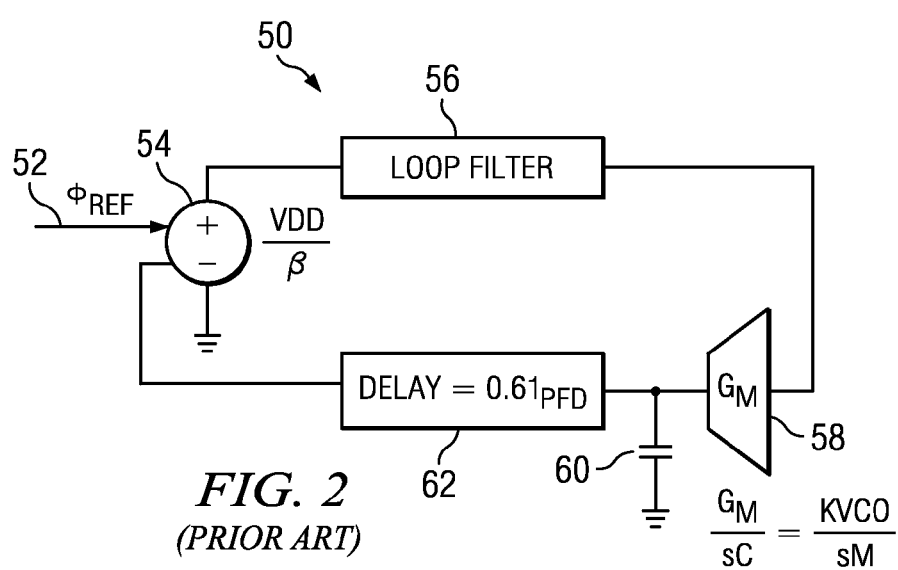
FIG. 2 is an electrical schematic diagram of a phase-domain model that models the loop behavior of the PLL of FIG. 1.
Figure 3:
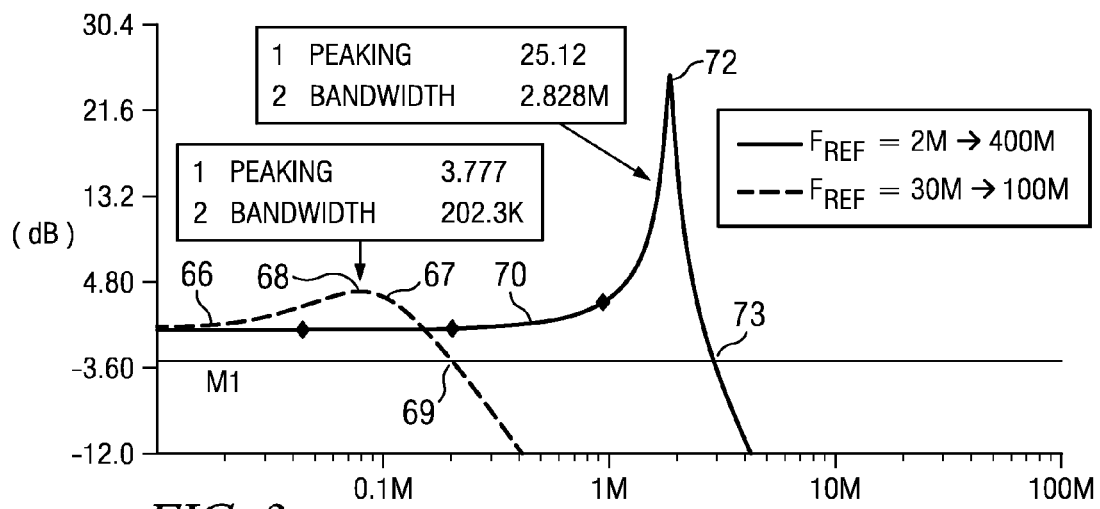
FIG. 3 is a graph of loop gain in dB verses frequency in megahertz for reference frequencies of 2 megahertz and 30 megahertz.
Figure 4:
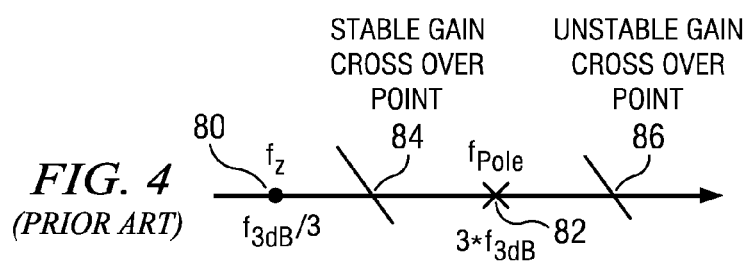
FIG. 4 is a graph of frequency illustrating the pole and zero of the PLL of FIG. 1 in relation to stable and unstable 3 dB crossover points.
Figure 5:
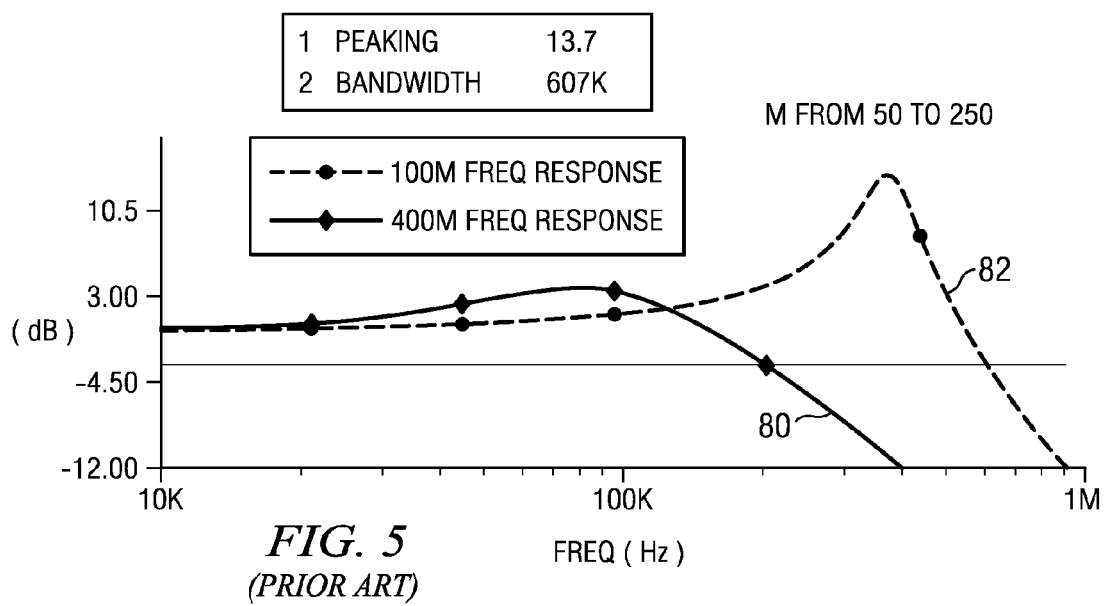
FIG. 5 is a graph of loop gain verses frequency of a PLL, comparing frequency responses of 100 MHz and 400 MHz in the PLL of FIG. 1.

In a manner similar to that described with reference to FIG. 1 above, the transconductance amplifier 28 produces an output current, $I_{VCO}$, on line 40 to control the frequency of a voltage-controlled oscillator (VCO) 42. The VCO 42 produces a base output frequency on line 44 that is proportional to the input voltage to the transconductance amplifier 28, which, as described above, is proportional to the amount of lead or lag of the phase of the feedback voltage on line 16 with respect to the internal reference frequency, $F_{REF\_INT}$. The output from the VCO 42 on line 44 may be divided by a number, for example $Q_{DIV}$, by a frequency divider to provide a frequency output, $F_{OUT}$, on output line 48. The output from the VCO 42 on line 44 may also be divided by a number, for example, $M_{DIV}$, to provide a frequency output on feedback line 16 to the second input of the DPFD 12 for comparison with the internal reference frequency, $F_{REF\_INT}$.

To automatically adjust the PLL in dependence on the frequency of the reference frequency, $F_{REF}$, that is applied, the output of the frequency detector 96 on line 106 presents a number of logic states to a state machine 108, which develops control signals to the charge-pump DAC 98, the capacitor DAC 102, and the capacitor DAC 104 on respective lines 110, 112, and 114. Thus, the state machine 108 configures the digital logic circuits of the charge-pump DAC 98 and the capacitor DAC circuits 102 and 104 so that the currents in the charge-pump DAC 98 and the capacitors of the capacitor DACs 102 and 104 are selected to compensate for the particular reference frequency, $F_{REF}$, applied to the APLL 90 to automatically maintain the loop bandwidth over the range of reference frequencies that may be expected to be employed.

Using traditional PLL parameters, $$\omega_n = \sqrt{\frac{I_{CP}K_v}{MC_1}}$$

$$\zeta = \frac{1}{2}\sqrt{\frac{I_{CP}K_vC_1}{M}}R_1$$

Thus, $$\omega_{3dB} = \frac{I_{CP}K_vR_1}{M}$$

where:
$\omega_n$ is the natural frequency of the loop
$I_{CP}$ is the charge-pump current=$k^2I_B$
$I_B$ is the input bias current
$K_v$ is the gain of the VCO
M is the feedback divisor
$C_1$ is the loop zero capacitance
$R_1$ is the loop zero resistance
$\zeta$ is the loop damping factor
$\omega_{3\ dB}$ is the 3 dB cross point for the loop ($\sim 2\zeta\omega_n$)
If we can generate
1) the charge-pump current, $I_{CP}$, to be proportional to $F_{OUT}$, that is $I_{CP}=k^2I_B*M*F_{REF\_INT}=k^2I_B*F_{OUT}$, and
2) $C_1$ proportional to $1/F_{REF\_INT}$, that is $C_1=C_U/F_{REF\_INT}$ then, $$\zeta_{eff} = \frac{1}{2}\sqrt{\frac{k^2I_BMF_{REF\_INT}K_vC_U}{MF_{REF\_INT}}}R_1 = \frac{R_1k\sqrt{I_BK_vC_U}}{2} \approx 1$$

$$\omega_n = \sqrt{\frac{k^2I_BMF_{REF\_INT}K_v}{M} \times \frac{F_{REF\_INT}}{C_U}} = kF_{REF\_INT}\sqrt{\frac{I_BK_v}{C_U}}$$

$$\omega_{3dB} = kI_BK_vR_1F_{REF\_INT}$$

where
$C_U$ is the total filter capacitor
$\zeta_{eff}$ is the effective damping of the loop
Thus, $f_{3\,dB} \propto F_{REF\_INT}$ To find $F_{OUT}$:
$I_{CP}(\mu A)=I_B(3.75\ mA)*M*F_{REF\_INT}(MHz)$
$F_{out}=M*F_{REF\_INT}=500$ mA with $I_{CP}=1.875\ \mu A$
$F_{out}=M*F_{REF\_INT}=100$ mA with $I_{CP}=0.375\ \mu A$
$C_1=120\ pF/F_{REF\_INT}(MHz)$
$F_{out}=500$ MHz, $F_{REF\_INT}=2$ MHz with M=250 and $C_1=50$ pF
$F_{out}=100$ MHz, $F_{REF\_INT}=30$ MHz with M=3 and $C_1=3.3$ pF An example of a frequency detector circuit 96 to provide input states to the state machine 108 in FIG. 6 is shown with additional reference now to FIG. 7. The example of a suitable frequency detector circuit 96 uses a monostable multivibrator circuit 120; however, it should be noted that the monostable multivibrator 120 is only an example of a signal source that is inexpensive to realize, and that many other circuit implantations could be equally advantageously employed.

In the example illustrated, the monostable multivibrator circuit 120 may be designed to oscillate at a 10 MHz frequency. It should be noted that 10 MHz has been selected as a convenient frequency against which the internal reference frequency, $F_{REF\_INT}$, can be compared; however, any other suitable frequency can be selected.

A current source 122 supplies a constant charging current, $I_{OSC}$, from a constant analog voltage supply, VDDA, to a capacitor 124. The node 126 between the current source 122 and capacitor 124 is connected to the inverting input of a comparator 128, and a bandgap voltage supply 130 is connected to the noninverting input of the comparator 128 to supply a stable voltage $V_{BG}$ thereto. The comparator 128 is referenced to a constant digital voltage source, VDDD.

The output from the comparator 128 is fed back to a switch 132 across the capacitor 124. The output of the comparator 128 is also supplied to an inverter 134 to provide the 10 MHz output frequency on output line 136. The inverter 134 is also referenced to the constant digital voltage supply, VDDD. Thus, in operation, when the charge on the capacitor 124 reaches the threshold of the comparator 128 established by the bandgap voltage VBG, the output of the comparator 128 will change states, closing the switch 132 to discharge the capacitor 124. The frequency of the monostable multivibrator can therefore be established by adjusting the size of the capacitor 124 and magnitude of its charging current, which determines the rate at which the capacitor 124 is charged.

Thus, with a monostable multivibrator of the type that provides a relatively stable output frequency, $F_{OUT}$, an estimate of the reference frequency, $F_{REF}$, may be made. To make this estimate, the 10 MHz output from the inverter 134 is connected to a counter 140, which counts 64 cycles of the 10 MHz signal (in 6.4 μs). At the same time, the internal reference frequency, $F_{REF}$, is applied to a counter 142. The counters 140 and 142 are reset whenever the user changes the input or output frequency of the PLL, functionally indicated by box 146. It should be noted that the 10 MHz frequency of the monostable multivibrator 120 and the count of the counter 140 are selected to enable the range of internal reference frequencies, FREF_INT, that are expected to be employed to be counted.

The outputs from the counters 140 and 142 are connected to a frequency calculator 144, which determines the number of cycles of the internal reference frequency, $F_{REF}$, that occur during the 64 cycles of the 10 MHz signal from the monostable multivibrator 120. The frequency calculator 144 produces output states representing the number of cycles of the internal reference frequency, $F_{REF}$, occurring during this period on output lines 106 to the state machine 108.

It will be recognized that the bandgap voltage supply 130 and the capacitor 124 have a very low temperature coefficient. Most of the frequency variation will come from the current source 122, $I_{OSC}$. The jitter/$F_{OSC}$ ripple in VDDA can be determined from:

$$I_{OSC} = \frac{C_{OSC}V_{BG}}{T}$$

$$f_{OSC} = \frac{I_{OSC}}{C_{OSC}V_{BG}}$$

$$\Delta f_{OSC} = \Delta I_{OSC} + \Delta C_{OSC} + \Delta V_{BG}$$

$$\Delta f_{OSC} = \pm 10\% \pm 5\% \pm 1\% = \pm 20\%$$

To determine $F_{OUT}$,
$I_{CP}(\mu A)=I_B(3.75\ mA)*M*F_{REF\_INT}(MHz)$
If Fout=M*$F_{REF\_INT}$=500 MHz,
this implies that $I_{CP}=1.875\ \mu A$
If Fout=M*$F_{REF\_INT}$=100 MHz
This implies that $I_{CP}=0.375$ uA
$C_1=120\ pF/F_{REF\_INT}(MHz)$
For Fout=500 MHz, $F_{REF\_INT}=2$ MHz, M=250 and $C_1=50$ pF
For Fout=100 MHz, $F_{REF\_INT}=30$ MHz, M=3 and $C_1=3.3$ pF Using this information, the various outputs from the state machine 108 in response to the frequencies determined by the frequency calculator 144 can be determined. Examples of some of the various states of the state machine 108 may assume to supply the control signals are shown in the table 160 of FIG. 8, to which reference is now additionally made. Thus, the outputs from the state machine 108 adjusts the capacitances of the capacitors in the charge-pump DAC 98, the capacitor DAC 102, and the capacitor DAC 104 in accordance with the states shown in the table 160 of FIG. 8.

Figure 9:
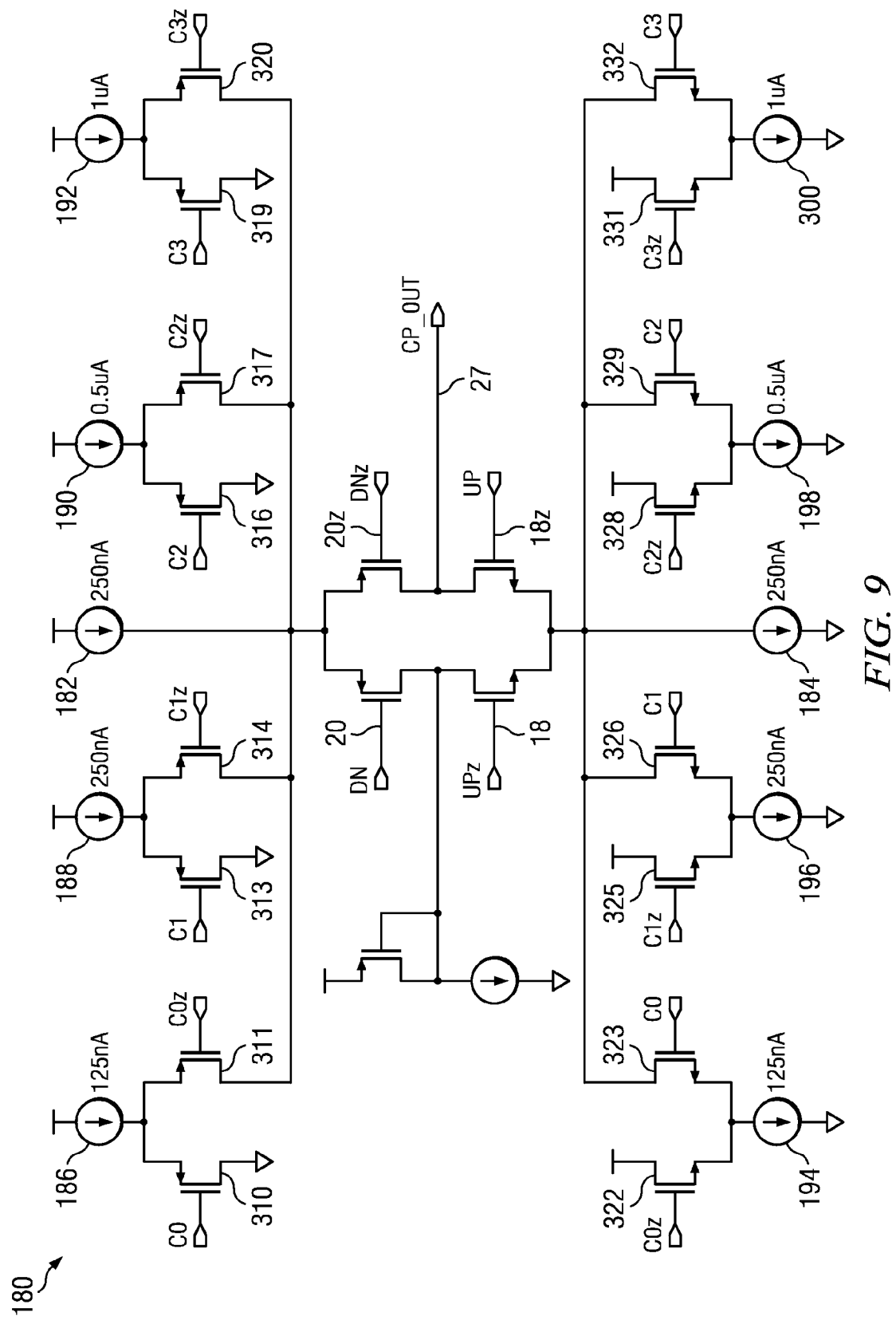
FIG. 9 is an electrical schematic diagram showing an example of a charge-pump DAC that may be employed in the autoconfigurable phase-locked loop (PLL) circuit of FIG. 6.

One construction of a charge-pump DAC 180 that may be used to provide the state-machine controlled capacitances is shown in FIG. 9, to which reference is now additionally made. The charge-pump DAC 180 receives up and down command signals from the digital phase-frequency detector (DPFD) 12 (see FIG. 6) on complementary input lines 18, 18z and 20, 20z respectively. The output is derived on output line CP_OUT 27.

Current is normally sourced to or sunk from the charge-pump circuit 180 by respective current sources 182 and 184, in the example illustrated, each supplying 250 nA. In addition, a number of additional current sources are switchably connectable to the charge-pump on both the supply side and sink side, to selectively supply additional current to the current supplied by the current sources 182 and 184. In the example illustrated, for example, current sources 186, 188, 190, and 192 are provided to selectively supply additional currents of 125 nA, 250 nA, 0.5 μA, and 1 μA to the charge-pump. Likewise, current sources 194, 196, 198, and 200 are provided to selectively sink additional currents of 125 nA, 250 nA, 0.5 μA, and 1 μA from the charge-pump.

The current sources 186, 188, 190, and 192 are controlled by signals from the state machine 108 by selectively switching on and off PMOS switch devices 310-311, 313-314, 316-317, and 319-320 respectively associated therewith. Likewise, the current sources 194, 196, 198, and 300 are controlled by signals from the state machine 108 by selectively switching off and on PMOS switch devices 322-323, 325-326, 328-329, and 331-332 respectively associated therewith. Since the current is either sourced or sunk from the charge-pump, the switches in the "up" side of the circuit are operated oppositely from the switches in the "down" side of the circuit.

Figure 10:
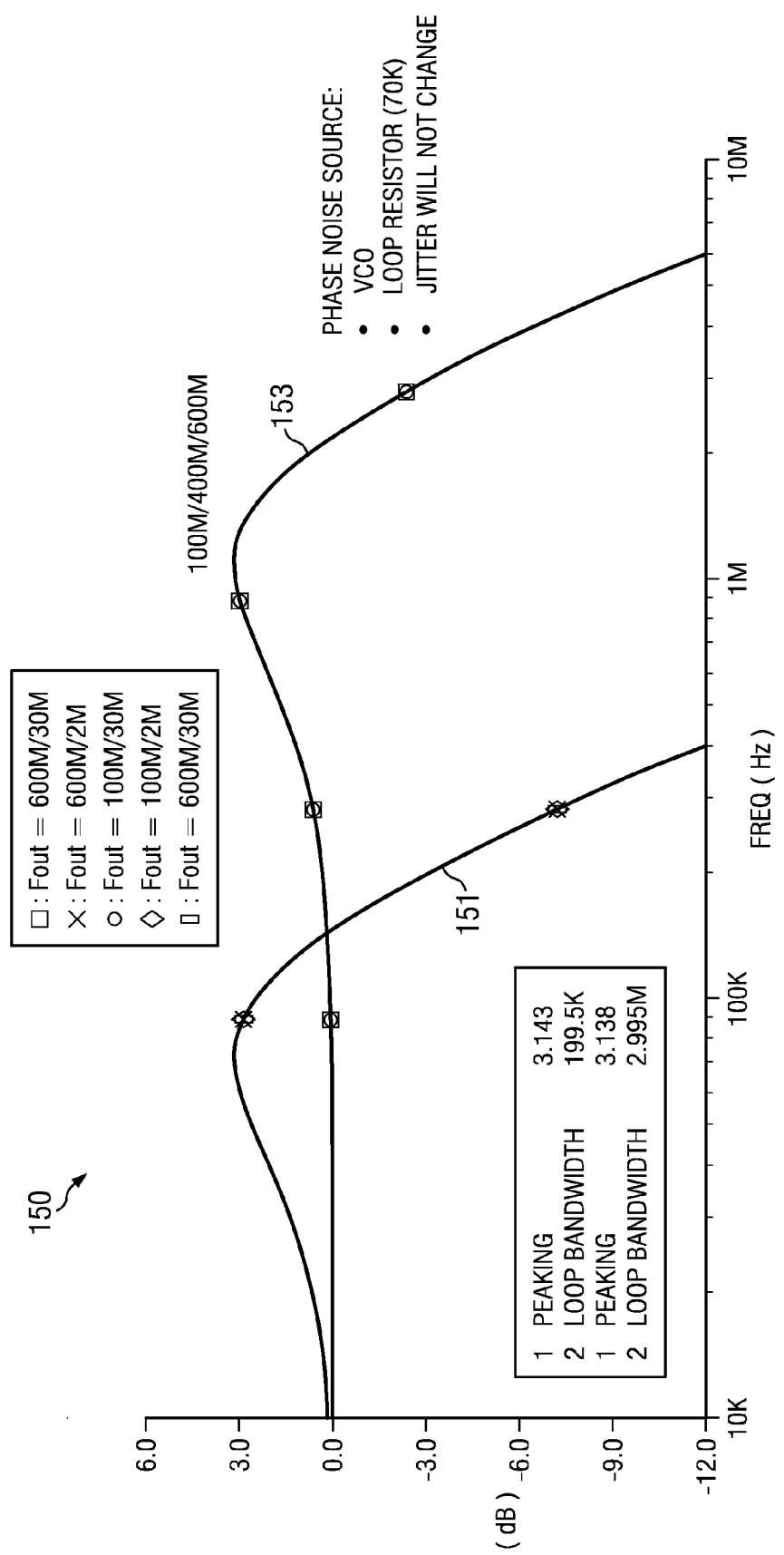
FIG. 10 shows the quantization error of the charge-pump DAC of FIG. 9.

The quantization error of the charge-pump DAC 180 is shown in FIG. 10, to which reference is now additionally made. In FIG. 10 the output frequencies, $F_{OUT}$, of the PLL with the various charge-pump values described above are shown for reference frequencies of 2 MHz and 30 MHz. Curve 151 shows the quantization error for an output frequency of 100 MHz with a 2 MHz reference frequency, and curve 153 shows the quantization error for an output frequency of 100 MHz with a 30 MHz reference frequency. It can be seen that the peaking of the 100 MHz output for a 2 MHz reference frequency is about 3.143, and the loop bandwidth is about 199.5 KHz. On the other hand, the peaking of the 100 MHz output for a 30 MHz reference frequency is about 3.143, and the loop bandwidth is about 2.995 MHz. The loop resistor 36 is constant, and in the example illustrated, is about 70 KΩ.

In the example illustrated:

$I_{CP}$(0.38μA-2.2 μA) DAC and its Q-noise $I_{CP\_DAC}$=0-3 μA (4 bit)

$I_{CP}$ error is 1−LSB=0.2 μA

Max error is $I_{CP}$=0.375 μA+$I_{err}$=0.575 μA $C_1$(4-60 pF) and its quantization noise $C_{1\_DAC}$=0-64 pF (5 bit)

$C_{1-DAC}$ error is 1−LSB=2 pF

Max error is $C_{1-DAC}$=4 pF+$I_{err}$=6 pF

Figure 11:
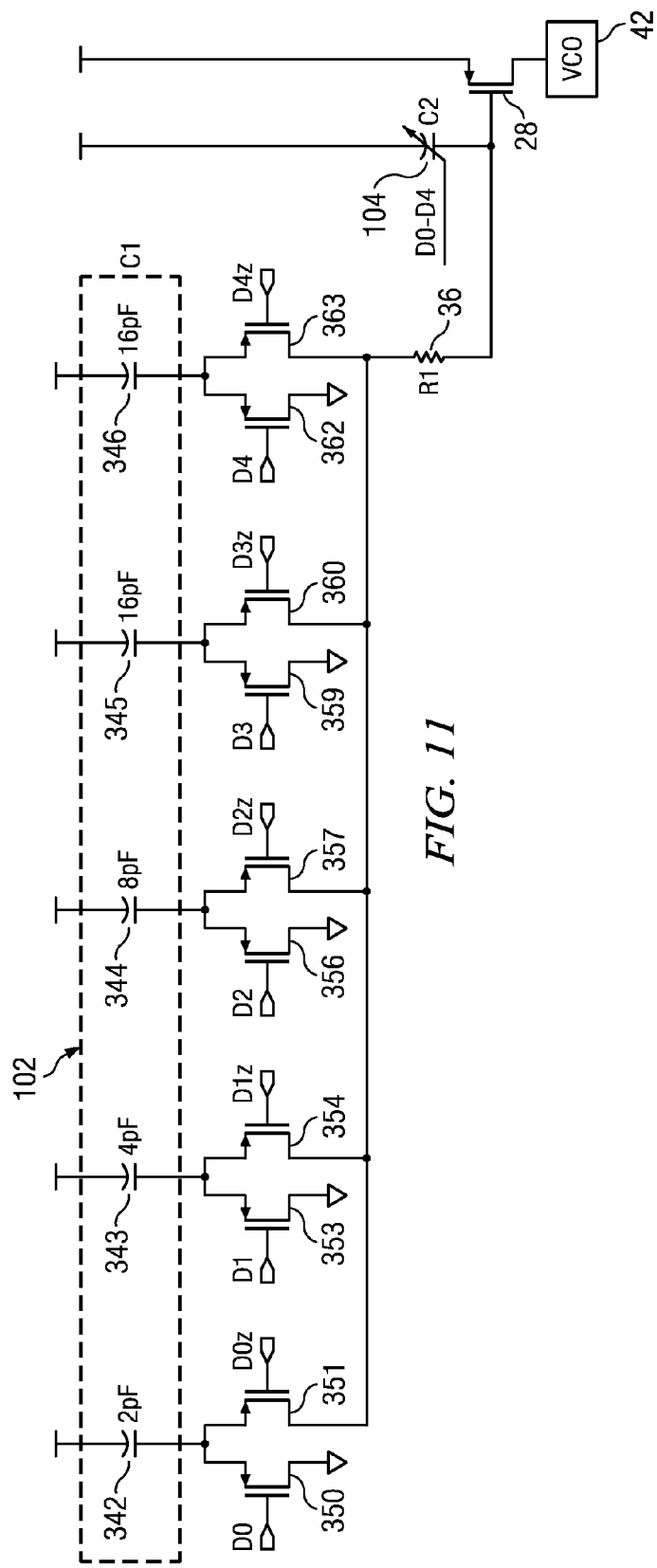
FIG. 11 is an electrical schematic diagram showing an example of a capacitor-DAC circuit that may be employed in the autoconfigurable phase-locked loop (PLL) circuit of FIG. 6.

An example of a capacitor DAC 102 that can be used in the autoconfigurable phase-locked loop (PLL) circuit 90 of FIG. 6 is shown in FIG. 11 to which reference is now additionally made. The capacitor DAC circuit 102 may be instantiated to provide selectable capacitances for both capacitor DAC circuits 102 and 104 in the circuit of FIG. 6, the capacitor DAC circuit 104 being shown as a variable capacitor in FIG. 11 for simplicity. The capacitor circuit 102 in FIG. 11 includes a number of capacitors 342-346 that may be selectively connected to a circuit output node 348 by a number of PMOS switches 350-351, 353-354, 356-357, 359-360, and 362-363. The various PMOS switches 350-351, 353-354, 356-357, 359-360, and 362-363 are controlled by outputs from the state machine 108 to selectively connect one or more of the capacitors 342-346 in parallel to provide a controllable capacitance.

Once an autoconfigurable phase-locked loop (PLL) circuit of the type described here is designed for a $F_{REF\_INT}$, the loop can automatically adjust itself to be stable over a range of reference frequencies, $F_{REF\_INT}$, from 2 MHz with an output frequency of 400 MHz. Moreover, once the loop is designed to have a stable charge-pump current, $I_{CP}$, the loop state machine 108 will automatically adjust the charge-pump current, $I_{CP}$, for other reference frequencies, $F_{REF}$, and other output frequencies, $F_{OUT}$.

For example, a. For $F_{OUT}$=400 MHz, $I_{CP}$=1.5 μA (designed Nominal value)

b. For $F_{OUT}'$=600 MHz, $I_{CP}'$=1.5 μA*600/400=2.25 μA

The loop state machine similarly scales $C_1$. That is once the loop is designed for one internal reference frequency, $F_{REF\_INT}$, and one output frequency, $F_{OUT}$, then the state machine scales it for all other values. For example, the loop can be designed for $F_{REF\_INT}$=2 MHz with $F_{OUT}$=400 MHz.

Auto Configuration algorithm $$I_{CP} = I_B * MF_{REF\_INT} = I_B * F_{OUT}$$

$$C_1 = C_U / F_{REF\_INT}$$

$$\frac{I_{CP1}}{I_{CP0}} = \frac{F_{OUT1}}{F_{OUT0}} = \frac{C_{CYC1}}{C_{CYC0}} = \kappa$$

$$\frac{C_{fil1}}{C_{fil0}} = \frac{F_{REF\_INT0}}{F_{REF\_INT1}} = \eta$$

With the minimum charge-pump current, $I_{CP\_min}$=0.25 μA and the minimum capacitance for $C_1$, $C_{1\_min}$=4 pF, if $I_{CP}$ changes from 0.375 to 2.25 therefore the ratio is 6. Thus, a 3-bit state machine may be used, and to minimize variations in $\omega_{3\,dB}$ and ζ a 4-bit DAC may be used. If $C_1$ changes from 4 pF to 60 pF, a 4 bit state machine may be used, and to minimize variation in $\omega_{3\,dB}$ and ζ a 5 bit DAC may be used.

The circuit is also relatively insensitive to PVT variations:

$$F_{OSC} \propto I_{OSC} = n \cdot I_B$$

This implies:

$$C_{CYC} = \frac{F_{REF\_INT}}{F_{OSC}} \propto \frac{1}{nI_B}$$

and $$I_{CP} \propto k^2 \cdot I_B \cdot MF_{REF\_INT}$$

If $I_B$ becomes "$\beta_{IB}$" from a PVT variation, then the charge-pump current, $I_{CP}$, and oscillator frequency, $F_{OSC}$, will increase by the same factor. Thus, the effective internal reference frequency, $F_{REF\_INT\_eff}$, will appear as $F_{REF\_INT}/\beta$.

$$\omega_{3dB} = kI_B K_v R_1 F_{REF\_INT}$$

$$\omega_{3dB\_eff} = k\beta \cdot I_B K_v R_1 \frac{F_{REF\_INT}}{\beta}$$

Figure 12:
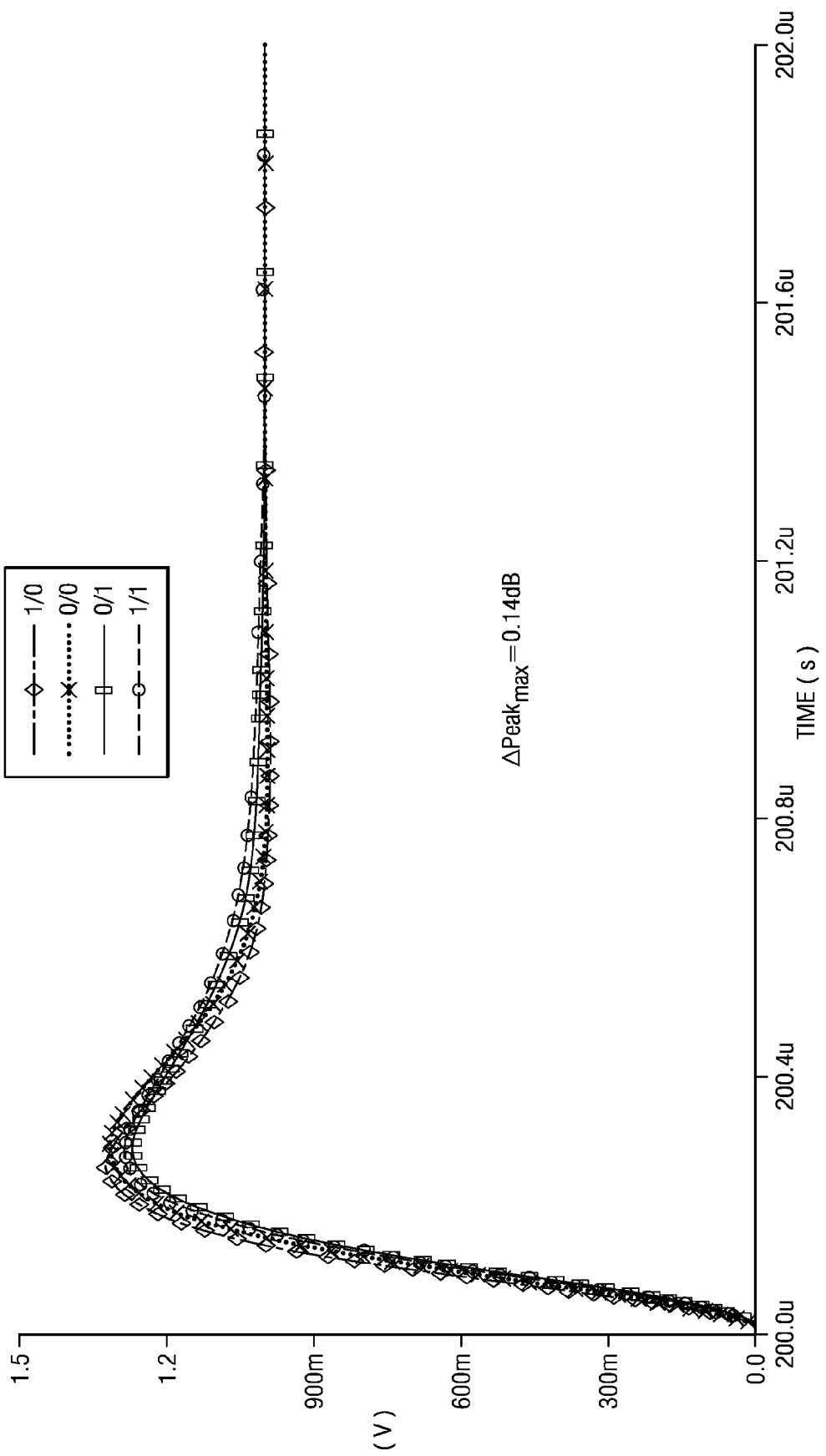
FIGS. 12 and 13 are graphs respectively showing step and frequency response in the PVT corners.
Figure 13:
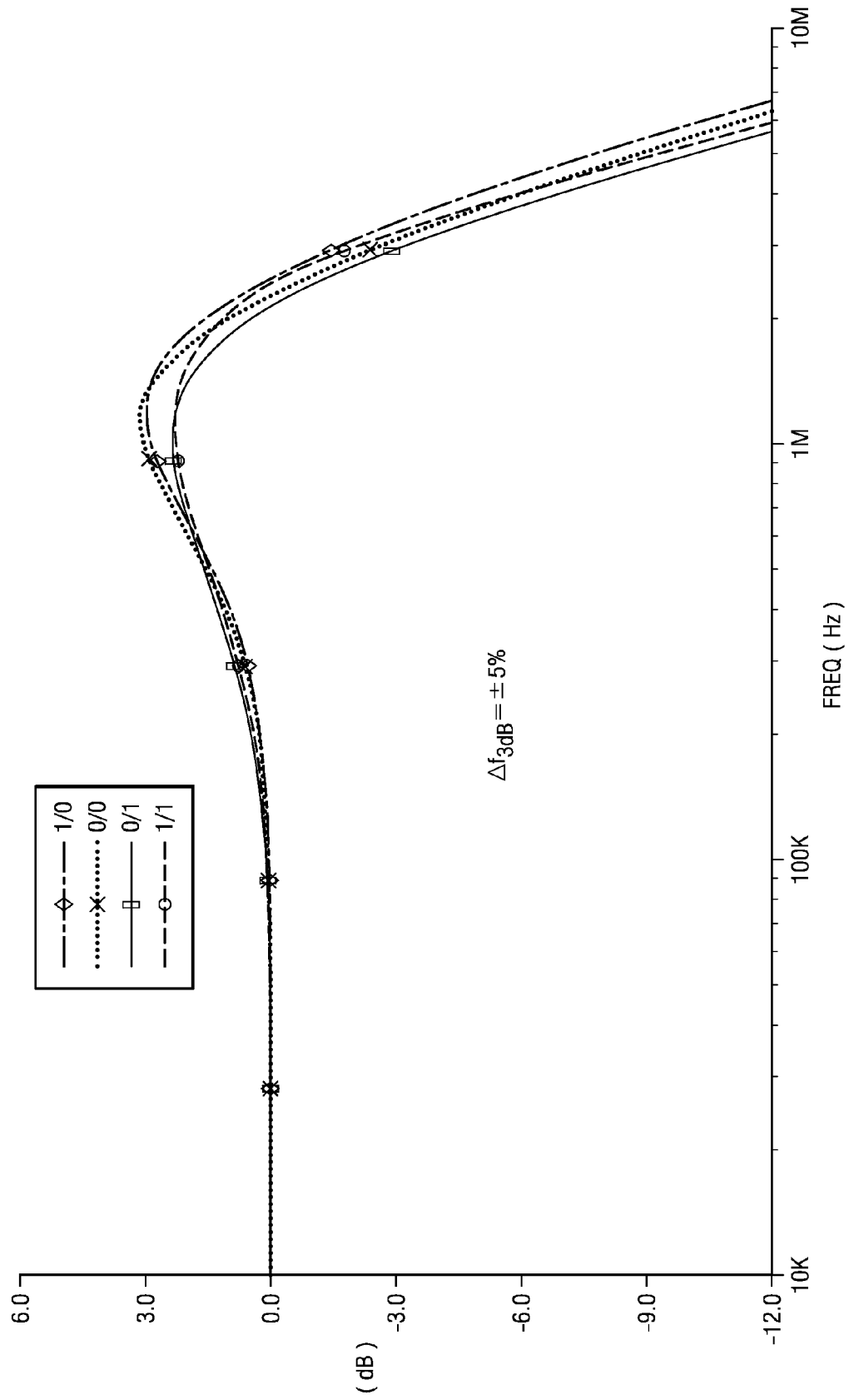

Thus, the effective value of $\omega_{3\,dB}$ does not change with process variation in the bias current. The algorithm works as ratio of numbers, which is accurate over process variation. Graphs of step and frequency response in the corners are shown respectively in FIGS. 12 and 13.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A phase-locked loop (PLL), comprising:
a frequency detector circuit for estimating a frequency of a reference frequency signal by counting a number of cycles of the reference frequency signal over a fixed period of time;
a phase detector for generating up and down command signals in response to phase differences between the reference frequency signal and a frequency signal related to a base PLL output frequency signal;
a circuit for producing control signals in dependence upon the frequency detected by said frequency detector;
a charge-pump DAC for generating a charge-pump output current, said charge-pump DAC being connected to receive said up and down command signals and control signals from said circuit;
an integrator for integrating said charge-pump output current, said integrator including a plurality of capacitors switchably selected by said control signals from said circuit for producing control signals to adjust an integrating capacitance value; and
a voltage controlled oscillator (VCO) for producing the base PLL output frequency signal in response to said integrated charge-pump output current;
wherein the frequency detector circuit includes an oscillator configured to produce a clock signal having a fixed frequency, a first counter coupled to the clock signal configured to count for a fixed number of cycles of the clock signal to form a fixed time period, and a second counter coupled to the reference frequency signal configured to count a number of cycles of the reference frequency signal during the fixed time period, such that an output of the second counter is proportional to the frequency of the reference frequency signal.

2. The PLL of claim 1, in which the oscillator is a monostable multivibrator circuit.

* * * * *